(12) United States Patent
Oh et al.

(10) Patent No.: US 9,231,546 B2
(45) Date of Patent: Jan. 5, 2016

(54) MULTI-DIMENSIONAL ARRAY OF IMPEDANCE ELEMENTS

(71) Applicant: THE REGENTS OF THE UNIVERSITY OF MICHIGAN, Ann Arbor, MI (US)

(72) Inventors: Sechang Oh, Ann Arbor, MI (US); Wanyeong Jung, Ann Arbor, MI (US); David Theodore Blaauw, Ann Arbor, MI (US); Dennis Michael Sylvester, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/298,051

(22) Filed: Jun. 6, 2014

(65) Prior Publication Data

US 2015/0357986 A1     Dec. 10, 2015

(51) Int. Cl.
*H03M 1/66* (2006.01)
*H03H 7/00* (2006.01)

(52) U.S. Cl.
CPC ............... *H03H 7/004* (2013.01); *H03M 1/66* (2013.01)

(58) Field of Classification Search
CPC ...... H03M 1/066; H03M 1/685; H03M 3/502
USPC .................................................. 341/144, 150
See application file for complete search history.

(56) References Cited

U.S. PATENT DOCUMENTS

| | | | |
|---|---|---|---|
| 4,412,208 A | 10/1983 | Akazawa et al. | |
| 4,910,514 A * | 3/1990 | Irmer et al. | 341/64 |
| 5,206,650 A | 4/1993 | Parle et al. | |
| 5,453,743 A * | 9/1995 | Kang | 341/144 |
| 5,684,487 A | 11/1997 | Timko | |
| 6,559,785 B2 * | 5/2003 | Kuttner | 341/155 |
| 6,621,444 B1 | 9/2003 | Confalonieri et al. | |
| 7,064,699 B2 * | 6/2006 | Sekiguchi | 341/144 |
| 7,102,557 B1 | 9/2006 | Frith | |
| 7,199,746 B1 | 4/2007 | Chowdhury et al. | |
| 7,307,567 B2 * | 12/2007 | Kuttner | 341/144 |
| 7,456,462 B1 | 11/2008 | Heshami et al. | |
| 7,473,955 B1 | 1/2009 | Heshami et al. | |
| 7,474,243 B1 * | 1/2009 | Kuttner | 341/144 |
| 8,456,342 B2 * | 6/2013 | Wu et al. | 341/150 |

(Continued)

FOREIGN PATENT DOCUMENTS

WO   WO 2014/064421   5/2014

OTHER PUBLICATIONS

Y. Chae et al, "A 6.3 µW 20 bit Incremental Zoom-ADC with 6 ppm INL and 1 µV Offset" *IEEE Journal of Solid-State Circuits*, vol. 48, No. 12, Dec. 2013, pp. 3019-3027.

(Continued)

*Primary Examiner* — Khai M Nguyen

(74) *Attorney, Agent, or Firm* — Pramudji Law Group PLLC; Ari Pramudji

(57) ABSTRACT

Circuitry formed of a two-dimensional regular array of capacitive elements 2 is coupled to decoding circuitry in the form of column decoder 8 and a row decoder 6. The decoders 8, 6 are used to select a start point and an end point within a sequence of selected capacitive elements to be connected in parallel following a horizontal raster scan arrangement. The selected capacitive elements may be used to generate an output voltage with a magnitude corresponding to the number of selected capacitive elements.

19 Claims, 5 Drawing Sheets

(56) References Cited

U.S. PATENT DOCUMENTS

| | | | |
|---|---|---|---|
| 8,847,806 B2* | 9/2014 | Kuttner et al. | 341/144 |
| 2003/0123646 A1 | 7/2003 | Srinivasan et al. | |
| 2003/0197636 A1 | 10/2003 | Confalonieri et al. | |
| 2004/0034499 A1 | 2/2004 | Regier | |
| 2005/0151680 A1 | 7/2005 | Kearney | |
| 2009/0102694 A1 | 4/2009 | Nittala et al. | |
| 2010/0001892 A1 | 1/2010 | Aruga et al. | |
| 2010/0097256 A1 | 4/2010 | Hurrell et al. | |
| 2010/0214140 A1 | 8/2010 | Reinhold et al. | |
| 2010/0283645 A1 | 11/2010 | Haneda | |
| 2011/0032134 A1 | 2/2011 | Cho et al. | |
| 2011/0200070 A1 | 8/2011 | Makinwa et al. | |
| 2012/0081243 A1 | 4/2012 | Kim et al. | |
| 2012/0112943 A1 | 5/2012 | Lin et al. | |
| 2012/0212357 A1 | 8/2012 | Haneda et al. | |
| 2012/0274489 A1 | 11/2012 | Chang et al. | |
| 2013/0044015 A1 | 2/2013 | Reinhold et al. | |
| 2013/0135125 A1 | 5/2013 | Schreiner et al. | |
| 2013/0182803 A1 | 7/2013 | Ishii et al. | |

OTHER PUBLICATIONS

Z. Tan et al, "A 1.2-V 8.3-nJ CMOS Humidity Sensor for RFID Applications" *IEEE Journal of Solid-State Circuits*, vol. 48, No. 10, Oct. 2013, pp. 2469-2477.

S. Xia et al, "A Capacitance-to-Digital Converter for Displacement Sensing with 17b Resolution and 20 μs Conversion Time" *ISSCC Dig. Tech. Papers*, 2012, 3 pages.

J. Markus et al, "Theory and Applications of Incremental ΔΣ Converters" *IEEE Transactions on Circuits and Systems-I*, vol. 51, No. 4, Apr. 2004, pp. 678-690.

K. Tanaka et al, "A 0.026mm$^2$ Capacitance-to-Digital Converter for Biotelemetry Applications Using a Charge Redistribution Technique" *IEEE Asian Solid-State Circuits Conference*, Nov. 2007, pp. 244-247.

P.J.A. Harpe et al, "A 26 μW 8 bit 10 MS/s Asynchronous SAR ADS for Low Energy Radios" *IEEE Journal of Solid-State Circuits*, vol. 46, No. 7, Jul. 2011, pp. 1585-1595.

* cited by examiner

MULTI-DIMENSIONAL ARRAY OF IMPEDANCE ELEMENTS

BACKGROUND OF THE INVENTION

1. Field of the Invention

This invention relates to the field of circuitry for connecting capacitive elements in parallel.

2. Description of the Prior Art

It is known to provide circuitry for connecting particular combinations of capacitive elements in parallel so as to provide a desired overall capacitance, or a signal derived as a consequence of that overall capacitance. Such circuits typically incur an undesired overhead in signal routing and selection circuitry complexity.

SUMMARY OF THE INVENTION

Viewed from one aspect the present technique provides circuitry comprising:
 a multi-dimensional array of impedance elements; and
 decoder circuitry configured to decode a selection signal to select a variable number of impedance elements within said array for connection in parallel, wherein
 said impedance elements have a sequence and said selection signal selects a plurality of adjacent impedance elements within said sequence to be connected together in parallel as a selected sequence, and
 said selection signal selects a start point of said selected sequence and an end point of said selected sequence.

The provision of a multi-dimensional array of impedance elements enables a simplification of the signal routing and the selection circuitry in a manner which reduces the overhead in terms of manufacturing difficulty and power consumption. The impedance elements have a sequence and the selection signal selects a variable number (as specified by the selection signal) of adjacent impedance elements within the sequence to be connected together in parallel as a selected sequence. Using such a predetermined sequence simplifies the selection and control overhead while in practice not introducing a significant restriction in the summed impedance which may be achieved by connecting impedance elements in parallel. The selection signals select a start point of the selected sequence and an end point of the selected sequence. Thus, a simplified selection signal may be utilised with a corresponding reduction in complexity and overhead.

While it will be understood that the impedance elements can be of a form providing resistance, inductance and/or capacitance individually, or in various combinations, at least some embodiments comprise a multi-dimensional array of capacitive elements.

In some embodiments, the multi-dimensional array is a two-dimensional array. Such two-dimensional arrays may be readily formed using conventional integrated circuit techniques.

Whilst it will be appreciated that the decoder circuitry may have different forms, in some embodiments the decoder circuitry comprises a row decoder and a column decoder. Such an arrangement readily scales as the array size increases.

In some embodiments the sequence may correspond to a raster scan sequence of position within the array. Such a raster scan sequence may be readily controlled.

In some embodiments each impedance element within the array may have adjacent associated selection circuitry which serves to select, when in a selected state, each of the impedance elements as one to be collected in parallel. The associated selection circuitry thus serves to respond to the selection signal to either connect its impedance element in parallel with the others within that selection or not to connect it in parallel as part of the selection.

In some embodiments, the selection signal serves to switch the selection circuitry at the start point into a selected state and to generate a propagate signal which then propagates between and switches to a selected state any selection circuitry disposed within the selected sequence extending from the start point to the end point with the selection circuitry at the end point serving to stop propagation of the propagated signal. In this way, a start point and an end point may be selected and the impedance elements in the sequence between the start point and end point are all switched into the selected state for connection in parallel without requiring individual selection signals to be applied to those intermediate impedance element from outside the array.

In some embodiments an impedance element and its associated selection circuitry may form an array element and a plurality of these array amounts may be disposed in a regular array. This arrangement readily scales and has advantageous uniformity.

Within some embodiments the multi-dimensional array may be bounded by impedance elements that are not selectable with the selection signal and serve as a buffer around the impedance elements that are selecting by the signal. Such a buffer serves to reduce variation in impedance provided by the impedance elements which are close to the edge of the region of impedance elements which may be selected to be connected in parallel.

It is convenient in some embodiments that the impedance elements have a nominally common impedance value. Whilst it may be appreciated that manufacturing and environmental differences may change the precise absolute impedance of the impedance elements, these elements may be designed and formed so as to have a nominally common impedance thereby providing an increased degree of freedom in which combinations of impedance elements may be combined to achieve an overall desired impedance from the impedance elements which are connected in parallel.

Within some embodiments the selection signal specifies a number of the impedance elements which are to be connected in parallel and the decoder circuitry may be configured such that upon successive decodings of selection signals specifying a common number, a different combination of impedance elements are connected in parallel. Thus, each selection signal specifying a given number of impedance elements to be connected in parallel will not result in the same individual instances of the impedance elements being connected in parallel thereby helping to reduce the influence of variations between individual elements by allowing these to be averaged over a larger set of impedance elements which may be selected for connection in parallel.

In some embodiments where the selection signal specifies a number of impedance elements to be connected in parallel, the decoder circuitry may serve such that upon successive decodings of the selection signal specifying the same number, chained and wrapping sequences of impedance elements within an overall sequence are selected such that an end of a given selected sequence abuts a start of a next selected sequence.

In some embodiments the selection signal is a multi-bit signal representing a number of the impedance elements to be connected in parallel. It is also possible for other encodings of the selection signal to be used.

While it is possible that the selection signal may act directly to connect the impedance elements in parallel, in some embodiments the number of impedance elements connected in parallel is updated based upon the selection signal in synchronism with an applied clock signal. The clock signal serves to synchronise the action of the selection signal across the array.

Whilst the multi-dimensional array of impedance elements could have a variety of different uses, one particular use is in a digital-to-analog converter where the multi-dimensional array of capacitive elements serves as part of a voltage generator configured to generate an output voltage at an output node with a value controlled by the selection signal.

The capacitive elements selected by the selection signal may be connected in parallel between a first node and the output node with the capacitive elements within the multi-dimensional array not selected by the selection signal being connected in parallel between a second node and the output node. Thus, the capacitive elements within the array are effectively divided into two sets by the selection signal, namely a first set connected in parallel and a second set connected in parallel.

In some embodiments the first node is held at a first reference voltage level and the second node is held in a second voltage level different from the first voltage level such that the output node is driven to an output voltage within a range from the first voltage level to the second voltage level with a value which is controlled by the selection signal.

Viewed from another aspect the present techniques provide circuitry comprising:

a multi-dimensional array of impedance means for providing an impedance; and decoder means for decoding a selection signal to select a variable number of impedance means within said array for connection in parallel, wherein said impedance means have a sequence and said selection signal selects a plurality of adjacent impedance means within said sequence to be connected together in parallel as a selected sequence, and said selection signal selects a start point of said selected sequence and an end point of said selected sequence.

Viewed from a further aspect the present invention provides a method of operating circuitry comprising the steps of:

providing a multi-dimensional array of impedance elements; and decoding a selection signal to select a variable number of impedance elements within said array for connection in parallel, wherein said impedance elements have a sequence and said selection signal selects a plurality of adjacent impedance elements within said sequence to be connected together in parallel as a selected sequence, and said selection signal selects a start point of said selected sequence and an end point of said selected sequence.

The above, and other objects, features and advantages of this invention will be apparent from the following detailed description of illustrative embodiments which is to be read in connection with the accompanying drawings.

DESCRIPTION OF THE EMBODIMENTS

Figure 1:
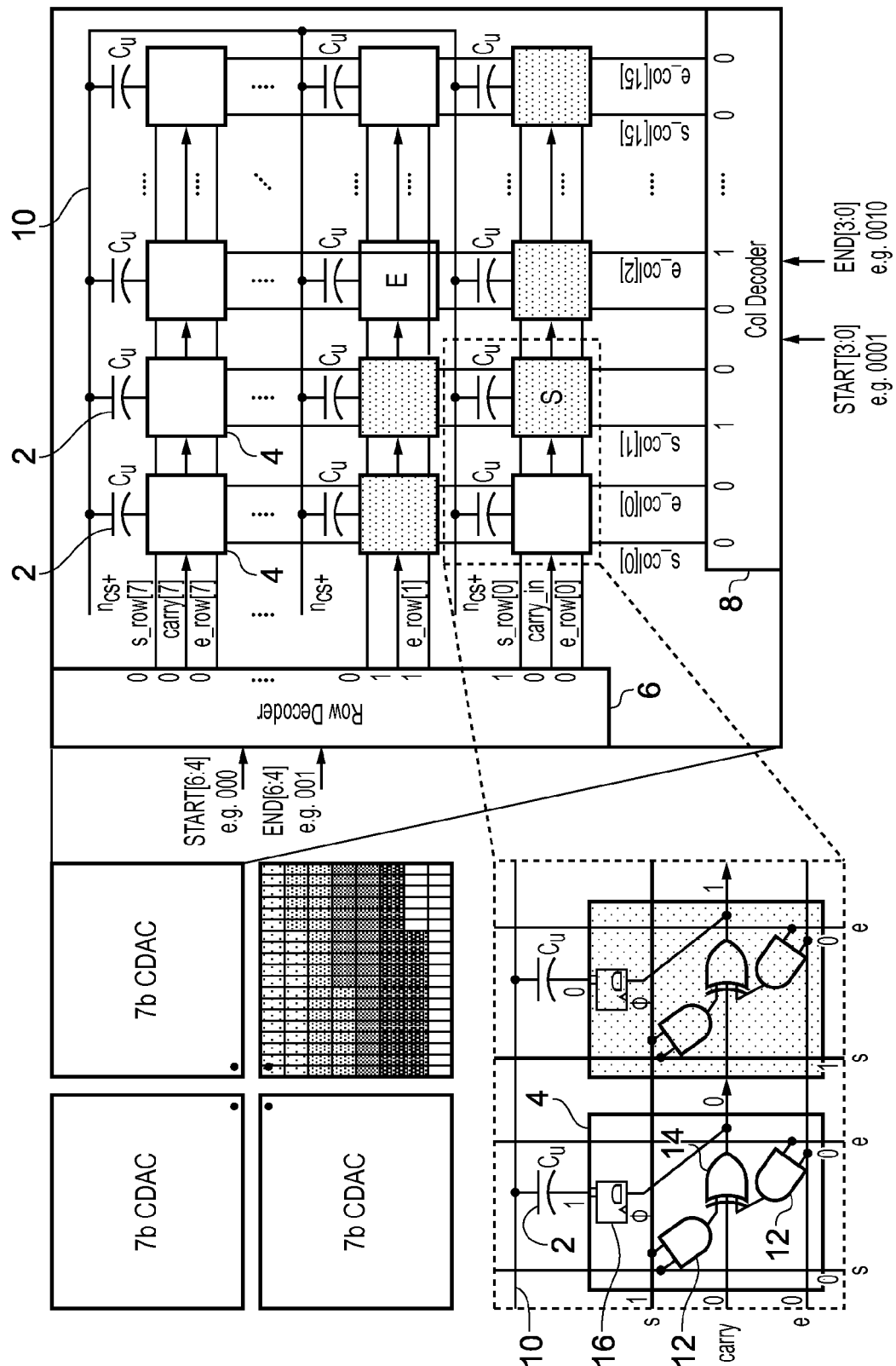
FIG. 1 schematically illustrates an array of impedance elements in the form of capacitive elements, decoder circuitry and selection circuitry associated with each of the capacitive elements.

FIG. 1 illustrates a two-dimensional array of capacitive elements 2 each having associated selection circuitry 4. It will be appreciated that capacitive elements are one example of inductance elements and other embodiments may use inductance elements providing resistance, inductance and/or capacitance individually or in various combinations. The following examples describe capacitive elements, but the present technique is not limited to the use of capacitive elements.

Decoding circuitry is formed of a row decoder 6 and a column decoder 8. Each capacitive element 2 and its associated selection circuitry 4 together comprise an array element. The two-dimensional array is a regular array. The array in this particular example embodiment is composed of eight rows and sixteen columns of array elements, although other dimensions are equally possible. The capacitive elements 2 in this example embodiment all have a nominally common capacitance. It will be appreciated that the precise absolute capacitance may vary due to, for example, manufacturing variation and environmental variation.

One terminal of each capacitive element 2 is connected to an output signal line 10 which forms an output node. The other terminal of each capacitive element is connected to either a Vdd signal on a first rail (node) or a ground voltage on a second rail (node). In operation, a selection of the capacitive elements 2 are connected between the output node and the Vdd voltage while a remainder of the capacitive elements 2 are connected between the ground voltage and the output node. The result of such a connection is that the output node adopts a voltage with a level between Vdd and ground with a magnitude depending on the relative proportion of the capacitive elements 2 which have been selected to connect to Vdd compared to those selected to connect to ground. Thus, by controlling the number of capacitive elements selected in each group, a digital selection signal may be transformed into an analog output voltage on the output node 10.

As illustrated in FIG. 1, a capacitive digital-to-analog converter may in practice include four of the arrays each illustrated as including 128 capacitive elements 2. This provides a total of 512 capacitive elements and accordingly a 9-bit resolution in the digital-to-analog conversion.

As illustrated in FIG. 1, the column decoder 4 receives two 4-bit selection signals which respectively specify a column which contains a starting point of a selected sequence and a column which contains the end point of a selected sequence. In a similar manner, the row decoder 6 receives a 3-bit selection signal specifying the row containing the start point and a 3-bit selection signal specifying the row containing the end point. Where the selected rows and columns intercept defines an individual array element which serves as a start point or an end point depending upon whether the start point selecting signals or the end point selecting signals are considered. The array elements are arranged in a sequence following a raster scan arrangement in the horizontal direction. The array element at the end point is not included within the currently selected sequence, but forms the start point, and is included within, the next selected sequence. The last of the elements included within the selected elements is thus (indirectly) specified by the end point selecting signals as being the element immediately preceding the elements at the intersection of the end row and column end signals. The end point may in other embodiments be directly specified.

The selection circuitry 4 is illustrated in more detail in FIG. 1 and is composed of two AND gates 12 and a 3-bit XOR gate 14. One of the AND gates 12 has its input connected to a start signal line in the row direction and a start signal line in the column direction. If both of these signal lines are asserted, then the output from that AND gate will be high. If either of the signal lines is not asserted, then the output from the AND gate 12 will be low. In a similar way, the second of the AND gates 12 is connected to a particular combination of an end signal line in the row direction and an end signal line in the column direction. If both of the end signal lines are asserted, then the output from the AND gate 12 will be high. If either of the end signal lines is not asserted, then the output from the AND gate will be low.

The outputs from the AND gates 12 are both fed to respective inputs of the XOR gate 14. The other input of the XOR gate 14 is a carry input which receives a propagating signal. If one or all three inputs to the XOR gate 14 are high, then the output from the XOR gate 14 is high. If two inputs to the XOR gate 14 are high, then the output of the XOR gate 14 is low.

The combined effect of the gates 12, 14 within the selection circuitry 4 is that when the start signals for a column and row that intersect at a particular instance of the selection circuitry are both asserted high, then this will result in the output of the XOR gate 14 at that instance of the selection circuitry also going high. The output from the XOR gate 14 serves as the propagate signal which is passed to the next instance of the selection circuitry in the raster scan sequence order. This propagate signal propagates along the raster scan sequence until the selection circuitry 4 is reached which is the end point of the selected sequence as indicated by the end column signal and the end row signal both being asserted for that particular instance of the selection circuits 4. Thus, the selected sequence follows the raster scan order and wraps at the end of the raster scan back to the beginning. The propagate signal itself does not wrap (it is floated at the of the end of the array), but the carry_in value supplied to the first element in the array is high if (end position)<(start position) and is low otherwise. The carry_in value of the last element is floated.

Using the above arrangement a selected sequence of array elements may be formed. Each selected array element uses the propagate signal which it generates to also supply a latch 16. A clock signal to the latch 16 captures this propagate signal in synchronism at all instances of the selection circuitry 4. The output from the latch 16 is either Vdd or ground depending upon the value of the propagate signal captured and is connected to one terminal of the associated capacitive element 2. The latch 16 output has an inverting output and so the negative terminal of capacitor is coupled to the latch output and connected to ground for a selected element.

The decoding circuitry is arranged to treat the end point specified for one selected sequence to serve as the start point of the next selected sequence (the element at the end point of the current sequence is not included within the selected elements for the current sequence). Accordingly, the capacitive elements 2 used to form the selected sequence vary for each selection such that, even if the selected sequence contains the same number of capacitive elements, these will be selected as a different subset of the array. This arrangement helps to average the variations in capacitance of the individual capacitive elements 2.

Figure 2:
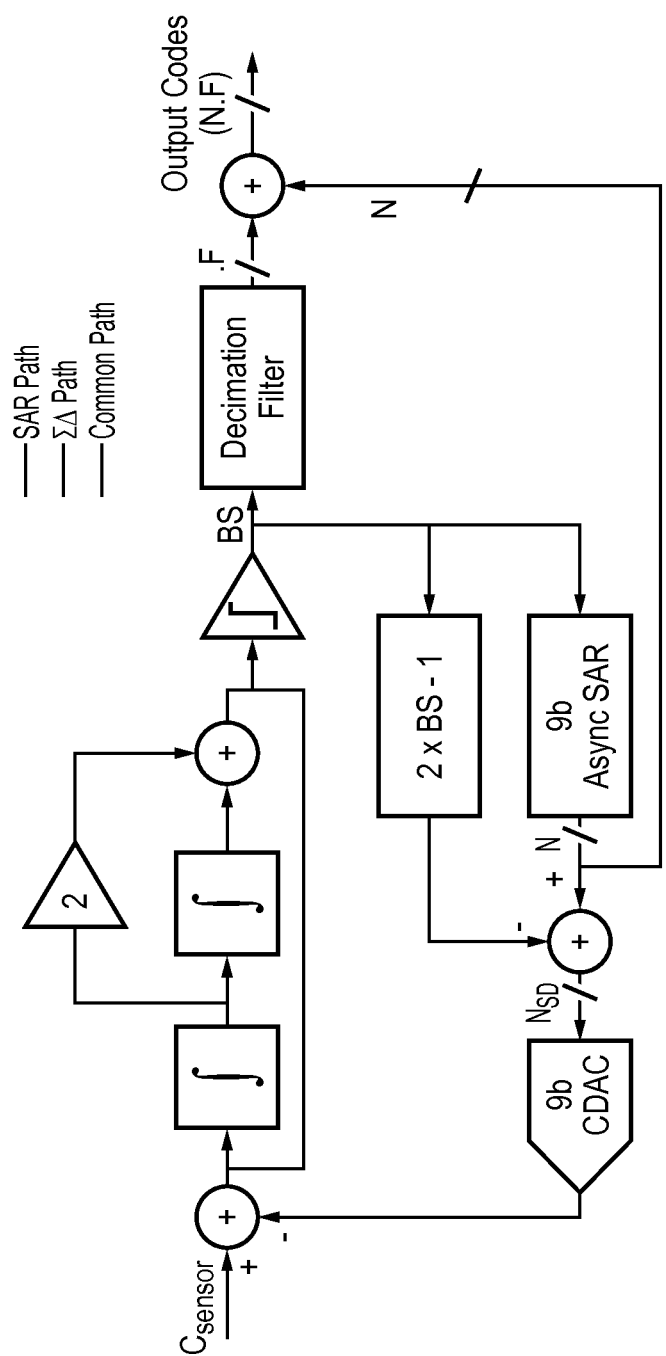
FIG. 2 schematically illustrates a capacitance-to-digital converter.
Figure 4:
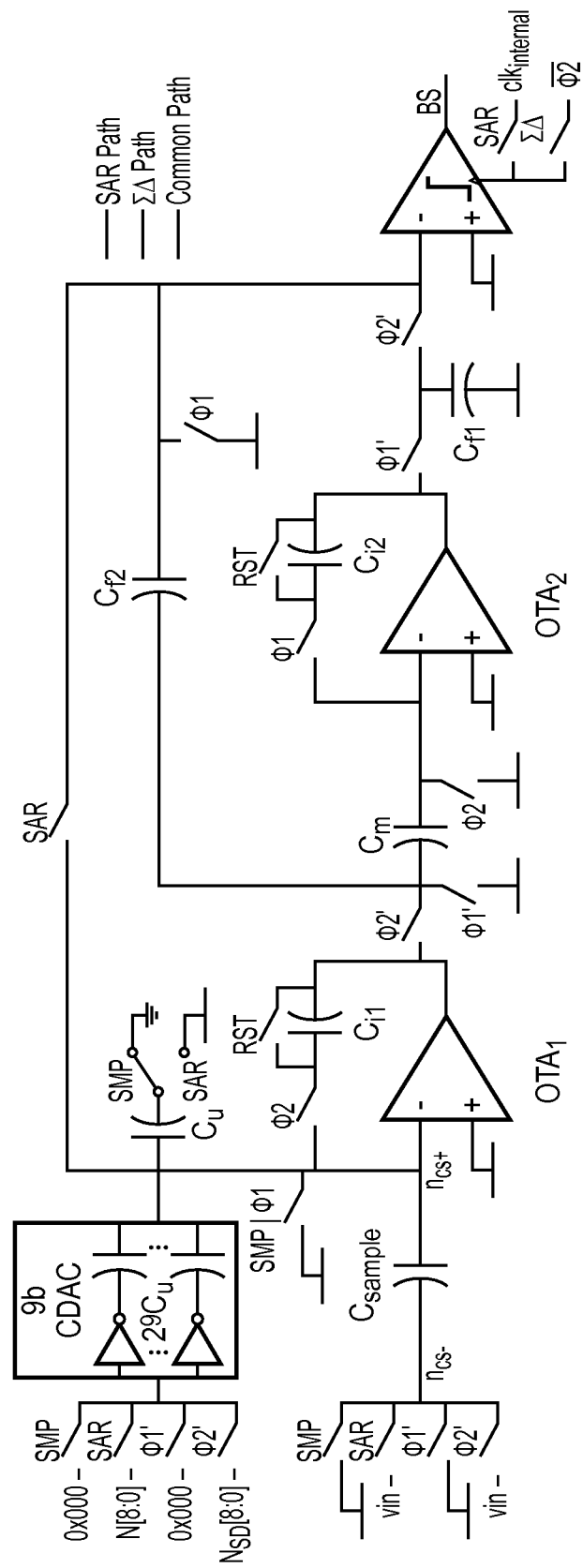
FIG. 4 schematically illustrates an example analog-to-digital converter.

FIG. 2 schematically illustrates an example implementation block diagram of a capacitance-to-digital converter. During the initial SAR state, the integration path is bypassed and the integer output component N is created by the successive approximation. This is followed by a high resolution second order incremental $\Sigma\Delta$ conversion that then produces the fractional helpful component F. For a capacitance-to-digital converter, the sensed capacitor (Csensor) is an off-chip component and an on-chip capacitive digital-to-analog converter is used for reference. This capacitive digital-to-analog converter has the form illustrated in FIG. 1. For an instrumentation application analog-to-digital converter, a fixed value capacitor (Csample) can be used and an input signal comes from a Vin port as is illustrated in FIG. 4.

In order to help reduce capacitive digital-to-analog converter mismatch, dynamic element matching is employed with the indexing/selecting structure as described in relation to FIG. 1. The two-dimensional array uses unit capacitor rotation with every cycle using the next neighbouring capacitors. Each unit capacitor is enabled when it falls between the asserted column/row start signal and one position before the end signals. Row and column decode logic 6, 8 generates the start and end signals using one-hot encoding. The start index is copied over from the end index at the rising edge of the clock which results in turning off all capacitors. Each unit capacitor bottom plate is latched with a delayed clock. A signal carry_in is used to invert the unit capacitance selection, which is appropriate when selected unit capacitors wrap around the end to the beginning of the array. The complete capacitive digital-to-analog converter is constructed from four smaller arrays organised in a common centroid layout.

Although not illustrated in FIG. 1, the array of active capacitive elements is surrounded by buffering capacitive elements which are not selectable by the selection signals. These help ensure similar environmental conditions for the capacitive elements at the edge of the selectable array compared to those away from the edge of the selectable array towards its centre.

Figure 3:
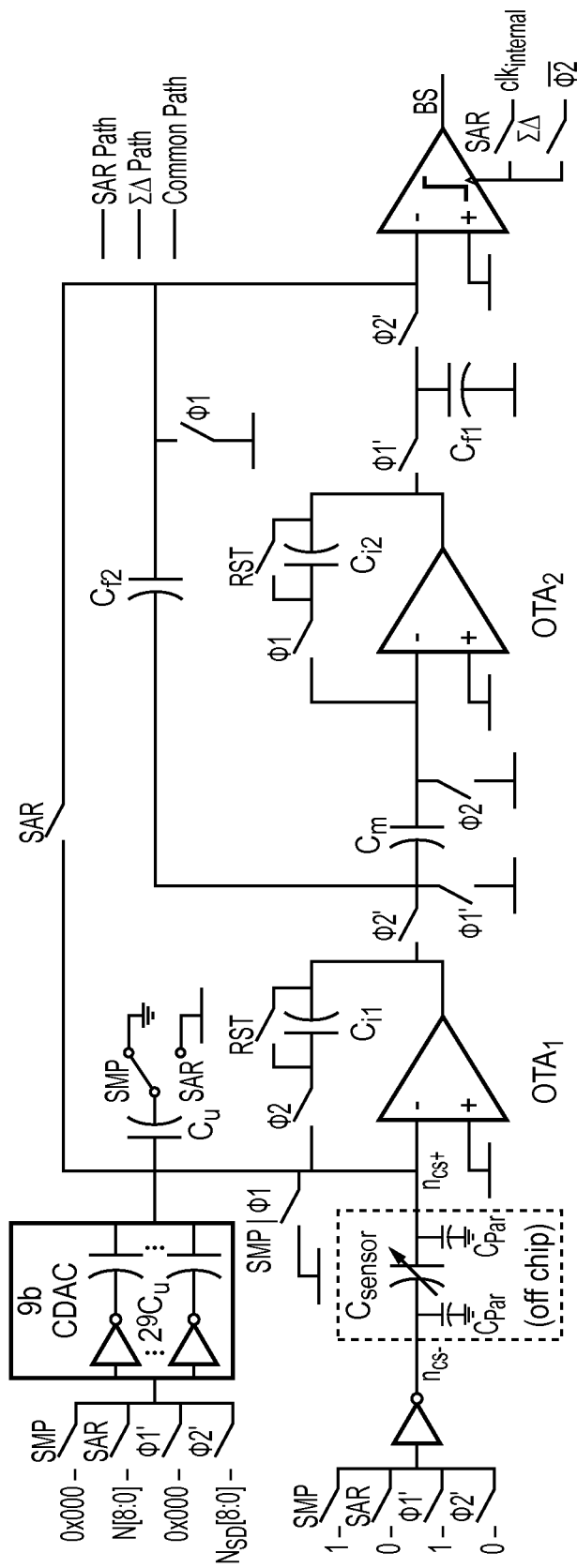
FIG. 3 schematically illustrates a capacitive digital-to-analog converter.

FIG. 3 illustrates in more detail an example implementation of the system of FIG. 2 showing integration of a 9-bit SAR and $\Sigma\Delta$ structure.

FIG. 4 schematically illustrates a circuit diagram similar to that of FIG. 3 but in this case used for analog-to-digital conversion purposes.

Figure 5:
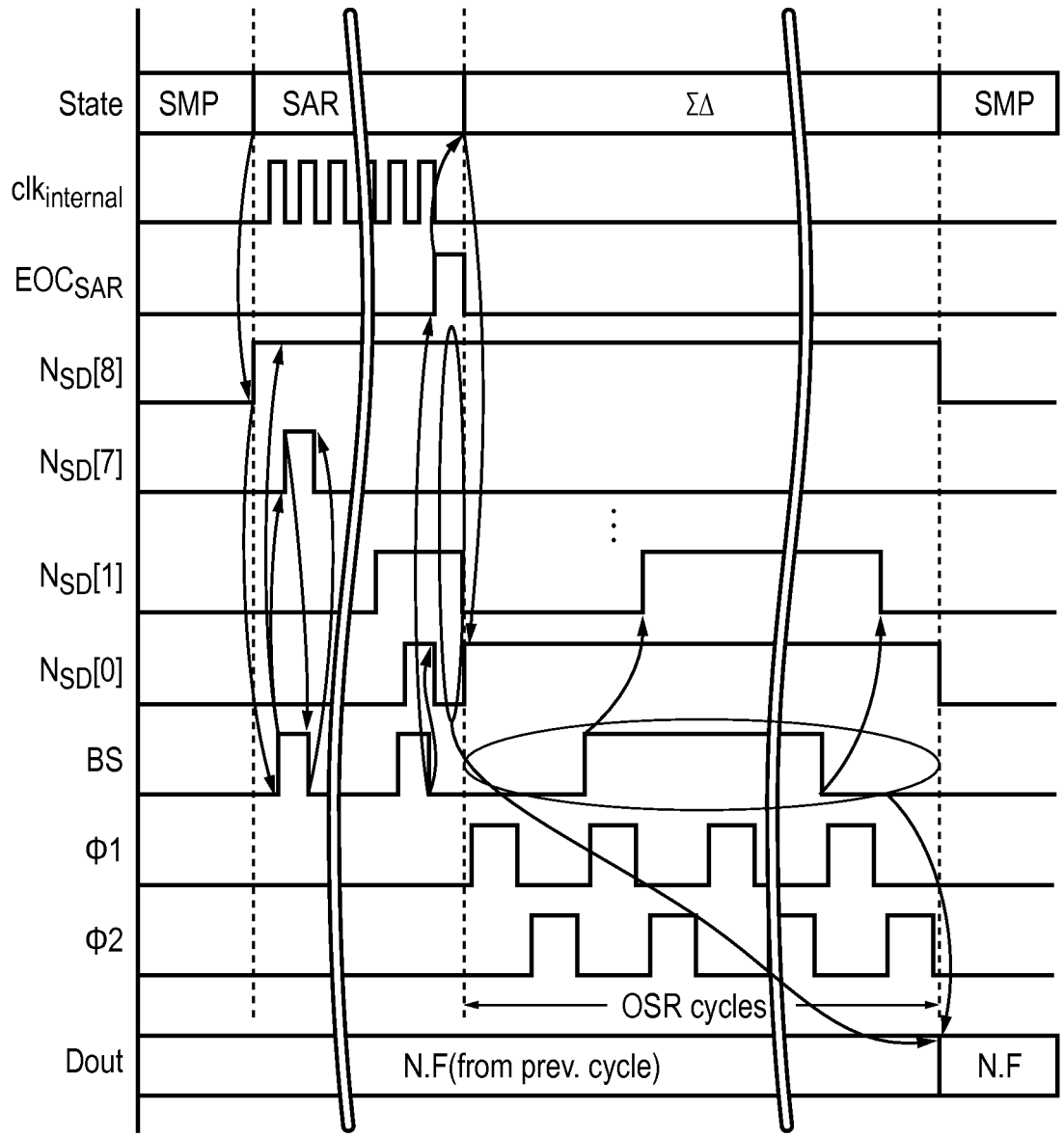
FIG. 5 is a waveform diagram useful in understanding the operation of circuitry of FIGS. 3 and 4.

FIG. 5 is a waveform diagram illustrating the control and operational signals and their relative timings together with the phases of sampling, SAR and $\Sigma\Delta$ operation for the circuits of FIGS. 3 and 4.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:
1. Circuitry comprising:
a multi-dimensional array of impedance elements; and
decoder circuitry configured to decode a selection signal to select a variable number of impedance elements within said array for connection in parallel, wherein
said impedance elements have a sequence and said selection signal selects a plurality of adjacent impedance elements within said sequence to be connected together in parallel as a selected sequence, and
said selection signal selects a start point of said selected sequence and an end point of said selected sequence.
2. Circuitry as claimed in claim 1, wherein said multi-dimensional array of impedance elements comprises a multi-dimensional array of capacitive elements.

3. Circuitry as claimed in claim 1, wherein said multi-dimensional array is a two-dimensional array.

4. Circuitry as claimed in claim 3, wherein said decoder circuitry comprises a row decoder and a column decoder.

5. Circuitry as claimed in claim 1, wherein said sequence corresponds to a raster scan sequence of position within said array.

6. Circuitry as claimed in claim 5, wherein each impedance element within said array has adjacent associated selection circuitry configured to select in a selected state said each impedance element to be connected in parallel.

7. Circuitry as claimed in claim 6, wherein
said selection signal switches selection circuitry at said start point into said selected state and generates a propagated signal;
said propagated signal propagates between, and switches to said selected state, any selection circuitry disposed within said selected sequence extending from said start point to said end point; and
switches selection circuitry at said end point to stop propagation of said propagated signal.

8. Circuitry as claimed in claim 6, wherein an impedance element and its associated selection circuitry form an array element, a plurality of said array elements disposed in a regular array.

9. Circuitry as claimed in claim 1, wherein said multi-dimensional array is bounded by impedance elements that are not selectable by said selection signal and serve as a buffer around said impedance elements that are selectable by said selection signal.

10. Circuitry as claimed in claim 1, wherein said impedance elements have a nominally common impedance value.

11. Circuitry as claimed in claim 10, wherein said selection signal specifies a number of said impedance elements to be connected in parallel and said decoder circuitry is configured such that, upon successive decoding of selection signals specifying a common number, a different combination of impedance elements are connected in parallel.

12. Circuitry as claimed in claim 10, wherein said selection signal specifies a number of said impedance elements to be connected in parallel and said decoder circuitry is configured such that, upon successive decoding of selection signals, chained and wrapping sequences of impedance elements within an overall sequence are selected such that an end of a given selected sequence abuts a start of a next selected sequence.

13. Circuitry as claimed in claim 1, wherein said selection signal is a multi-bit signal representing a number of said impedance elements to be connected in parallel.

14. Circuitry as claimed in claim 1, wherein a number of said impedance elements connected in parallel is updated based upon said selection signal in synchronism with an applied clock signal.

15. A digital-to-analog converter comprising circuitry as claimed 1 serving as part of a voltage generator configured to generate an output voltage at an output node with a value controlled by said selection signal.

16. An digital-to-analog converter as claimed in claim 15, wherein
said impedance elements within said multi-dimensional array selected by said selection signal are connected in parallel between a first node and said output node; and
said impedance elements within said multi-dimensional array not selected by said selection signal are connected in parallel between a second node and said output node.

17. An digital-to-analog convertor as claimed in claim 16, wherein said first node is held at a first reference voltage level and said second node is held at a second reference voltage level different from said first reference voltage level such that said output node is driven to said output voltage having a value in a range from said first reference voltage level to said second reference voltage level.

18. Circuitry comprising:
a multi-dimensional array of impedance means for providing an impedance; and
decoder means for decoding a selection signal to select a variable number of impedance means within said array for connection in parallel, wherein
said impedance means have a sequence and said selection signal selects a plurality of adjacent impedance means within said sequence to be connected together in parallel as a selected sequence, and
said selection signal selects a start point of said selected sequence and an end point of said selected sequence.

19. A method of operating circuitry comprising the steps of:
providing a multi-dimensional array of impedance elements; and
decoding a selection signal to select a variable number of impedance elements within said array for connection in parallel, wherein
said impedance elements have a sequence and said selection signal selects a plurality of adjacent impedance elements within said sequence to be connected together in parallel as a selected sequence, and
said selection signal selects a start point of said selected sequence and an end point of said selected sequence.

* * * * *